United States Patent [19]

Schrader

[11] 4,282,539
[45] Aug. 4, 1981

[54] FIELD EFFECT TRANSISTOR WITH DECREASED SUBSTRATE CONTROL OF THE CHANNEL WIDTH

[75] Inventor: Lothar Schrader, Munich, Fed. Rep. of Germany

[73] Assignee: Siemens Aktiengesellschaft, Berlin & Munich, Fed. Rep. of Germany

[21] Appl. No.: 73,899

[22] Filed: Sep. 10, 1979

[30] Foreign Application Priority Data

Sep. 29, 1978 [DE] Fed. Rep. of Germany ....... 2842589

[51] Int. Cl.³ ............................................ H01L 29/78
[52] U.S. Cl. ....................... 357/23; 357/41; 357/91
[58] Field of Search ............................. 357/23, 41, 91

[56] References Cited

U.S. PATENT DOCUMENTS

| | | | |
|---|---|---|---|
| 4,011,105 | 3/1977 | Paivinen | 148/1.5 |
| 4,011,576 | 3/1977 | Uchida | 357/23 |
| 4,193,080 | 3/1980 | Koike | 357/23 |
| 4,198,252 | 4/1980 | Hsu | 148/187 |

FOREIGN PATENT DOCUMENTS 2641334 3/1978 Fed. Rep. of Germany .

Primary Examiner—Martin H. Edlow
Attorney, Agent, or Firm—Hill, Van Santen, Steadman, Chiara & Simpson

[57] ABSTRACT

An insulated gate field effect transistor has a channel region in a doped semiconductor substrate covered by a thin film region of the insulating layer and has borders defined by thick film regions disposed parallel to the source-drain direction. The transistor further includes a pair of narrow strip zones in the region of the channel borders also running parallel to the source-drain direction which are doped weaker than and oppositely to the substrate doping to partially compensate the substrate doping and in transistors of the depletion type can overcompensate the substrate doping. The compensation provided by the strip zones decreases the substrate control effect so that the effective channel width of the transistor is less susceptible to fluctuations in operating voltages.

6 Claims, 2 Drawing Figures

FIELD EFFECT TRANSISTOR WITH DECREASED SUBSTRATE CONTROL OF THE CHANNEL WIDTH

BACKGROUND OF THE INVENTION

1. Field of the Invention

The present invention relates to an insulated gate field effect transistor, and in particular such a transistor having compensating strips in the area of the channel borders to decrease change in the channel width as a result of operating voltage fluctuations.

2. Description of the Prior Art

Conventional operation of insulated gate field effect transistors is such that a gate voltage supplied to the gate electrode creates a space charge zone in the channel region in the substrate forming an inversion layer in a region where the minority carriers dominate, the inversion layer being comprised of carriers of an opposite conductivity type to the substrate doping. In field effect transistors operating in the enhancement mode, the inversion layer becomes greater with increasing gate voltage so that current flow in the channel region increases.

Fluctuations in the substrate bias voltage supplied to the source result in a change in the potential of the source region which causes a change in the width of the inversion layer so that the effective width of the channel region of the transistor is also changed. A similar consequence occurs as a result of fluctuations in the gate and drain regions. An increasing difference between the potential of the source region and the reference potential results in a decrease of the effective channel width.

A field effect transistor operating in the depletion mode has a space charge zone formed without the presence of a gate voltage so that the changes in the effective width of the channel region as a result of fluctuations of operating potentials are even more pronounced.

A method for the manufacture of insulated gate field effect transistors is known from German OS No. 2,641,334 in which a semiconductor substrate is covered with a thick film insulating layer, portions of which are removed by photolithographic steps. A masking layer is applied over the entire semiconductor surface, including the openings in the insulating layer, and is subsequently removed from the thick film regions, so that the masking layer now covers only the openings. Ion implantation is then undertaken utilizing both the masking layer and the thick film insulation as a mask. After removal of the masking layer a thin film insulating layer is applied to the openings to form the insulated gate over the channel region.

SUMMARY OF THE INVENTION

An insulated gate field effect transistor having decreased substrate control of the channel width has a semiconductor substrate of a first conductivity type having source and drain regions therein, and has a gate electrode connected above the channel region through an insulating layer. The channel region is defined by edges of thick film insulation on the substrate surface with the effective channel region being covered by a thin film layer of insulation.

In the regions of the channel borders, running parallel to the source-drain direction, narrow strip zones of implanted ions of a conductivity opposite to the substrate conductivity are generated. The strip zones extend along the entire length of the channel borders and have an upper surface co-planar with the substrate upper surface. The doping of the strip zones is weaker than the substrate doping and acts to compensate the substrate doping. In transistors operating in the enhancement mode, the substrate doping may only be increased to the extent that when the gate voltage is disconnected no current flows. In transistors operating in the depletion mode, a more extensive decreasing of the substrate doping can occur, to the extent that an over-compensation of the substrate doping results so that the conducting type of the semiconductor in the strip zones reverses. The effect of fluctuations in the operating voltages is thereby substantially decreased, and the normally resulting change in the effective channel width is thereby also minimized. The use of the strip zones thus results in a field effect transistor having a substantially constant channel width over a large portion of its operating range.

DESCRIPTION OF THE PREFERRED EMBODIMENTS

Figure 1:
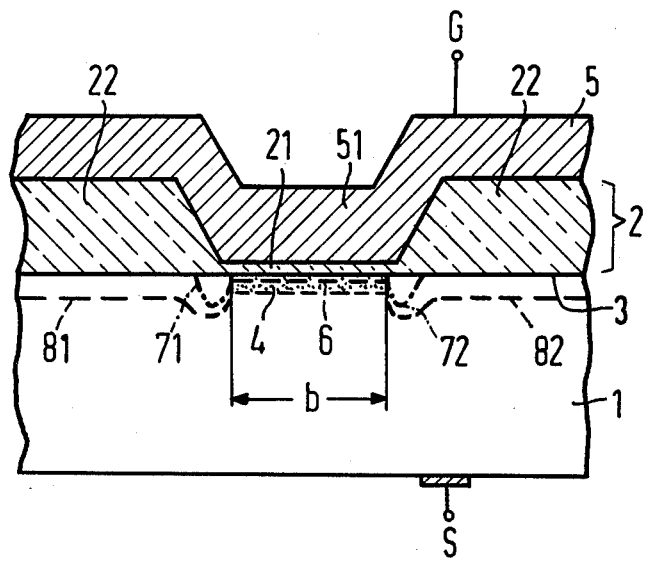
FIG. 1 is a sectional view of a field effect transistor having decreased substrate control of the channel width constructed in accordance with the principles of the present invention.

A field effect transistor having decreased substrate control of the channel width is shown in section in FIG. 1. The transistor consists of a doped semconductor substrate 1 having a source connection S. The substrate 1 may, for example, consist of p-type silicon with acceptor doping of $7 \cdot 10^{14}$ cm$^{-3}$.

The substrate 1 has an upper surface 3 which is covered by an insulating layer 2 comprised of n-type material. The insulating layer 2 consists of thick film areas 22 which surround a thin film insulating layer 21. A source region and a drain region are provided in the substrate 1 generally lying in a plane perpendicular to the plane of the drawing in the conventional manner and are not shown. The area between the drain and source and beneath the thin film insulating layer 21 is the channel region 4 which has a width which is generally defined by the edges of the thick film insulating regions 22. The thick film regions 22 may, for example, be of a thickness of approximately 500 nm, whereas the thin film region 21 may have a thickness of approximately 50 nm.

A conducting gate structure 5 covers the insulating layer 2 and has a gate connection G and may, for example, be comprised of aluminum or of highly doped polycrystalline silicon. The gate structure 5 has a central section 51 lying above the channel region 4, so that the effective gate of the transistor shown in FIG. 1 consists of the parts 1, 21 and 51, with the source and drain regions conventionally associated therewith.

Thus far, a conventional insulated gate field effect transistor has been described, and the operation of the transistor of FIG. 1 is briefly as follows. A gate voltage is supplied to the terminal G which creates a space charge zone in the channel region 4 resulting in the generation of an inversion layer 6, represented by the dashed line in FIG. 1. The inversion layer shown in FIG. 1 has a width b. In a field effect transistor operating in the enhancement mode the gate voltage must be present for the generation of the space charge zone and the inversion layer 6, with the latter becoming stronger with increasing gate voltage so that the current flow in the channel region 4 increases.

Fluctuations of the potential in the source region with respect to a reference voltage, which may be set by a substrate bias voltage supplied at S, or fluctuations of the other operating voltages leads to changes in the width b of the inversion layer which determines the effective width of the channel region 4 in the transistor. Every change in the difference between the potential of the source region and the reference potential results in a decrease of the effective channel width.

In field effect transistors operating in the depletion mode, the space charge zone and the inversion layer 6 are formed in the absence of a gate voltage. The previously discussed fluctuations in operating potential with respect to the reference potential in this case result in an increased effective width b of the channel region. The above-described phenomena are referred to as the so-called substrate control effect.

In order to overcome these problems present in conventional insulated gate field effect transistors, the present invention is provided with a pair of narrow strip zones 71 and 72 which are implanted in the region of the boundaries of the channel region 4, i.e., generally beneath the interior edges of the thick film regions 22. The zones 71 and 72 are parallel to the source-drain direction, that is, normal to the image plane in FIG. 1.

The zones 71 and 72 are doped with a conductivity type opposite to that of the substrate 1 to bring about conduction opposed to the substrate carrier flow. If the semiconductor substrate 1 is comprised of p-type material, the zones 71 and 72 will be implanted with donors. The doping in the zones 71 and 72 is also weaker than the substrate doping.

In transistors operating in the enhancement mode the substrate doping may only be decreased to the extent that no current flows between the connection G and the zones 71 and 72 when the gate voltage is switched off. In transistors operating in the depletion mode, the zones 71 and 72 can result in a greater decrease in the substrate doping, and may even over-compensate the substrate doping so that the conducting type of the zones 71 and 72 is reversed.

Field effect transistors operating in the depletion mode conventionally utilize an opposed doping in the channel region 4 and which will be of the same conductivity type as the zones 71 and 72, however, the zones 71 and 72 will have a more concentrated doping.

It is also known to provide insulated gate field effect transistors with additional doping beneath the thick film regions 22 on the surface of the substrate 1 to increase the concentration of the substrate doping. Such zones in which an additional doping is present are indicated at 81 and 82 in FIG. 1. The purpose of the zones 81 and 82 is to generate inversion layers underneath the regions 22 which are less significant than the inversion layer 4 in the channel region to provide better insulating characteristics with respect to adjacent circuit parts. This occurs because the presence of the zones 81 and 82 increases the cutoff voltages at G which cause inversion layers to arise beneath the regions 22. The inversion layers which do arise beneath the regions 22 are less detrimental to operation of the transistor than those which would arise in the absence of the zones 81 and 82. An additional result, however, is that a doping leap or discontinuity appears at the lateral limitations of the more weakly doped channel region 4. As a result, additional depletion layers form at these limitations or boundaries which will extend into the channel region 4 as a function of fluctuations in the operating potentials opposite to the reference potential. The zones 71 and 72 when positioned as shown in FIG. 1 at the edges of the thick film layers 22 are provided with additional doping which compliments the substrate doping so that they act to decrease or completely eliminate this additional substrate control effect.

The problems discussed above are particularly noticeable in the case of transistors operating in the depletion mode because such transistors exhibit a relatively small channel width, so that fluctuations in the channel width have a great effect upon operation of the transistor. Transistors of this type are customarily connected as load elements, with the gate connected to the source region. Use of the zones 71 and 72 in transistors of this type greatly insures constant operation relatively independent of operating voltage fluctuations.

Figure 2:
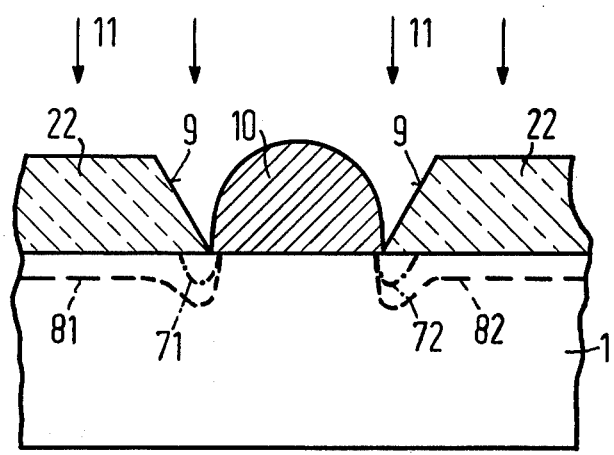
FIG. 2 is a sectional view of the transistor of FIG. 1 showing masking during the ion implantation step.

A step in a process for manufacturing the transistor of FIG. 1 is shown in FIG. 2, in which elements already designated in FIG. 1 are identified with the same reference symbols. For the production of the field effect transistor of FIG. 1 according to the inventive process, a continuous insulating layer having a thickness corresponding to the thick film regions 22 is applied to the surface 3 of the semiconductor substrate 1. The insulating layer is covered with a light-sensitive layer, for example, photoresist, which is applied by conventional photolithograhic steps to only cover the regions 22 which are intended to remain. The portions of the insulating layer which are not covered by the light-sensitive layer are removed, so that the opening designated at 9 results. A masking layer consisting of, for example, an aluminum layer, is applied over the substrate to cover both the thick film regions 22 and the opening 9.

Following this step, the light-sensitive layer covering the thick film regions 22 is loosened, and removed along with the portions of the masking layer located thereon, so that only the portion of the masking layer applied to the inside of the opening 9 remains, resting directly upon the semi-conductor substrate 1, and designated at 10 in FIG. 2.

An ion implantation step is then conducted, generally indicated by the arrows 11 in FIG. 2, consisting of ions to bring about a conductivity opposed to the substrate doping in the semiconductor substrate 1, and the implantation energy is chosen just large enough so that the thick film regions 22 will serve as an implantation mask in conjunction with the masking portion 10, so that the strip zones 71 and 72 will be generated in narrow portions between the parts 10 and 22 in the general boundary region of the channel region 4. The masking portion 10 is then removed and the portion of the semiconductor substrate 1 which is exposed thereby is then covered with the thin film region 21 of the insulating layer. Finally, the thin film region 21 and the thick film regions 22 are covered by a conducting layer by conventional photolithographic steps and the terminals G and S are applied. If the gate structure 5 is formed out of polycrystalline silicon, it can be utilized as a doping mask for the applicaton of the source and drain regions in the semiconductor substrate 1 by means of further ion implantation.

If additional doping is to be provided to generate the zones 81 and 82, such doping can be undertaken by ion implantation after the application of the masking portion 10 and the removal of the remaining mask covering the thick film regions 22. If the structure 1 is of a p-type material, acceptors are implanted. These may be implanted with a large implantation energy of approximately 150 to 200 keV, so that the thick film regions 22 have no masking effect.

It will be understood that the exemplary conduction types discussed in connection with the above invention can be reversed without departing from the inventive concept disclosed herein.

Although modifications and changes may be suggested by those skilled in the art it is the intention of the inventor to embody within the patent warranted hereon all changes and modifications as reasonably and properly come within the scope of his contribution to the art.

I claim as my invention:

1. An insulated gate field effect transistor comprised of a semiconductor body of a first conductivity type having a first doping level, a source region and a drain region of the opposite conduction type in the semiconductor body, an insulating layer covering an upper surface of the semiconductor body, said insulating layer having thick film regions surrounding a thin film region, said thin film region disposed above an area of the semiconductor body between the source and drain regions to define a channel region in the semiconductor body, and a pair of narrow strip zones in the semiconductor body parallel to a source-to-drain direction and disposed at the edges of said channel region, said strip zones having additional doping of a conductivity type opposite to the first conductivity type.

2. The insulated gate field effect transistor of claim 1 which further comprises additional regions in said semiconductor body beneath said thick film regions doped with a conductivity type to increase the concentration of the substrate doping, said additional regions extending to and terminating adjacent said channel region with said strip zones implanted in said additional regions on each side of said channel region.

3. The insulated gate field effect transistor of claim 1 wherein said transistor is of the depletion type.

4. The insulated gate field effect transistor of claim 3 wherein said gate and said source region are conductively connected with each other.

5. The insulated gate field effect transistor of claim 4 wherein said semiconductor substrate has an additional doping in said channel region, said additional doping being opposed to said substrate doping to reverse the conduction type of said channel region, with the strip zones having a doping concentration exceeding said additional doping in said channel region.

6. The insulated gate field effect transistor of claim 1 wherein said transistor is of the enhancement type.

* * * * *